(12) United States Patent
Xie et al.

(10) Patent No.: US 11,615,830 B2
(45) Date of Patent: *Mar. 28, 2023

(54) PERFORMING A REFRESH OPERATION BASED ON A CHARACTERISTIC OF A MEMORY SUB-SYSTEM

(71) Applicant: Micron Technology, Inc., Boise, ID (US)

(72) Inventors: Tingjun Xie, Milpitas, CA (US); Seungjune Jeon, Santa Clara, CA (US); Zhengang Chen, San Jose, CA (US); Zhenlei Shen, Milpitas, CA (US); Charles See Yeung Kwong, Redwood City, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/339,047

(22) Filed: Jun. 4, 2021

(65) Prior Publication Data
US 2021/0295900 A1    Sep. 23, 2021

Related U.S. Application Data

(63) Continuation of application No. 16/514,840, filed on Jul. 17, 2019, now Pat. No. 11,056,166.

(51) Int. Cl.
*G11C 11/00*     (2006.01)
*G11C 11/406*    (2006.01)
*G11C 11/16*     (2006.01)

(52) U.S. Cl.
CPC .... *G11C 11/40607* (2013.01); *G11C 11/1673* (2013.01); *G11C 11/1675* (2013.01); *G11C 11/40626* (2013.01)

(58) Field of Classification Search
CPC .......... G11C 11/40607; G11C 11/1673; G11C 11/1675; G11C 11/40626
See application file for complete search history.

(56) References Cited

U.S. PATENT DOCUMENTS

| | | | |
|---|---|---|---|
| 10,586,592 B1 | 3/2020 | McGlaughlin | |
| 10,672,486 B2 | 6/2020 | Zhu | |
| 10,761,727 B2 * | 9/2020 | Rayaprolu | G06F 3/0655 |
| 11,056,166 B2 * | 7/2021 | Xie | G11C 11/40607 |
| 11,080,205 B2 * | 8/2021 | Yang | G06F 12/0882 |

(Continued)

OTHER PUBLICATIONS

PCT International Search Report and Written Opinion for International Application No. PCT/US2020/042461, dated Oct. 26, 2020, 11 pages.

*Primary Examiner* — Pho M Luu
(74) *Attorney, Agent, or Firm* — Lowenstein Sandler LLP

(57) ABSTRACT

A media management operation can be performed at a memory sub-system at a current frequency. An operating characteristic associated with the memory sub-system can be identified. The operating characteristic can reflect at least one of a write count, a bit error rate, or a read-retry trigger rate. A determination can be made as to whether the identified operating characteristic satisfies an operating characteristic criterion. In response to determining that the operating characteristic satisfies the characteristic criterion, the media management operation can be performed at a different frequency relative to the current frequency.

20 Claims, 7 Drawing Sheets

(56) References Cited

U.S. PATENT DOCUMENTS

| | | |
|---|---|---|
| 2010/0157671 A1 | 6/2010 | Mokhlesi |
| 2011/0320688 A1 | 12/2011 | Lee |
| 2015/0301932 A1 | 10/2015 | Oh et al. |
| 2015/0363261 A1 | 12/2015 | Warnes et al. |
| 2019/0115062 A1 | 4/2019 | Mylavarapu |
| 2020/0019459 A1 | 1/2020 | Cadloni |
| 2020/0089569 A1 | 3/2020 | Cadloni |

* cited by examiner

410

| Write Count | 0 to 10k | 10k to 100k | 100k to 1 million |
|---|---|---|---|
| Refresh Period | 48 hours | 30 hours | 18 hours |

420

| Temperature | 0 – 20°C | 20 – 35°C | ... | 65°C + |
|---|---|---|---|---|
| Refresh Period | 40 hours | 30 hours | ... | 16 hours |

430

| Write Count/ Temperature | 0 – 20°C | 20 – 35°C |
|---|---|---|
| 0 to 10k | 64 hours | 52 hours |
| 10k to 100k | 40 hours | 32 hours |
| 100k to 1 million | 28 hours | 22 hours |

FIG. 4

PERFORMING A REFRESH OPERATION BASED ON A CHARACTERISTIC OF A MEMORY SUB-SYSTEM

RELATED APPLICATIONS

This application is a continuation of U.S. patent application Ser. No. 16/514,840, filed Jul. 17, 2019, now U.S. Pat. No. 11,056,166, issued Jul. 6, 2021, entitled "PERFORMING A REFRESH OPERATION BASED ON A CHARACTERISTIC OF A MEMORY SUB-SYSTEM," the entire contents of which is hereby incorporated by reference herein.

TECHNICAL FIELD

The present disclosure generally relates to a memory sub-system, and more specifically, relates to performing a refresh operation based on a characteristic of a memory sub-system.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIG. 4 illustrates various examples of the updating of the frequency of a refresh operation based on various threshold conditions in accordance with some embodiments of the present disclosure.

DETAILED DESCRIPTION

Figure 1:
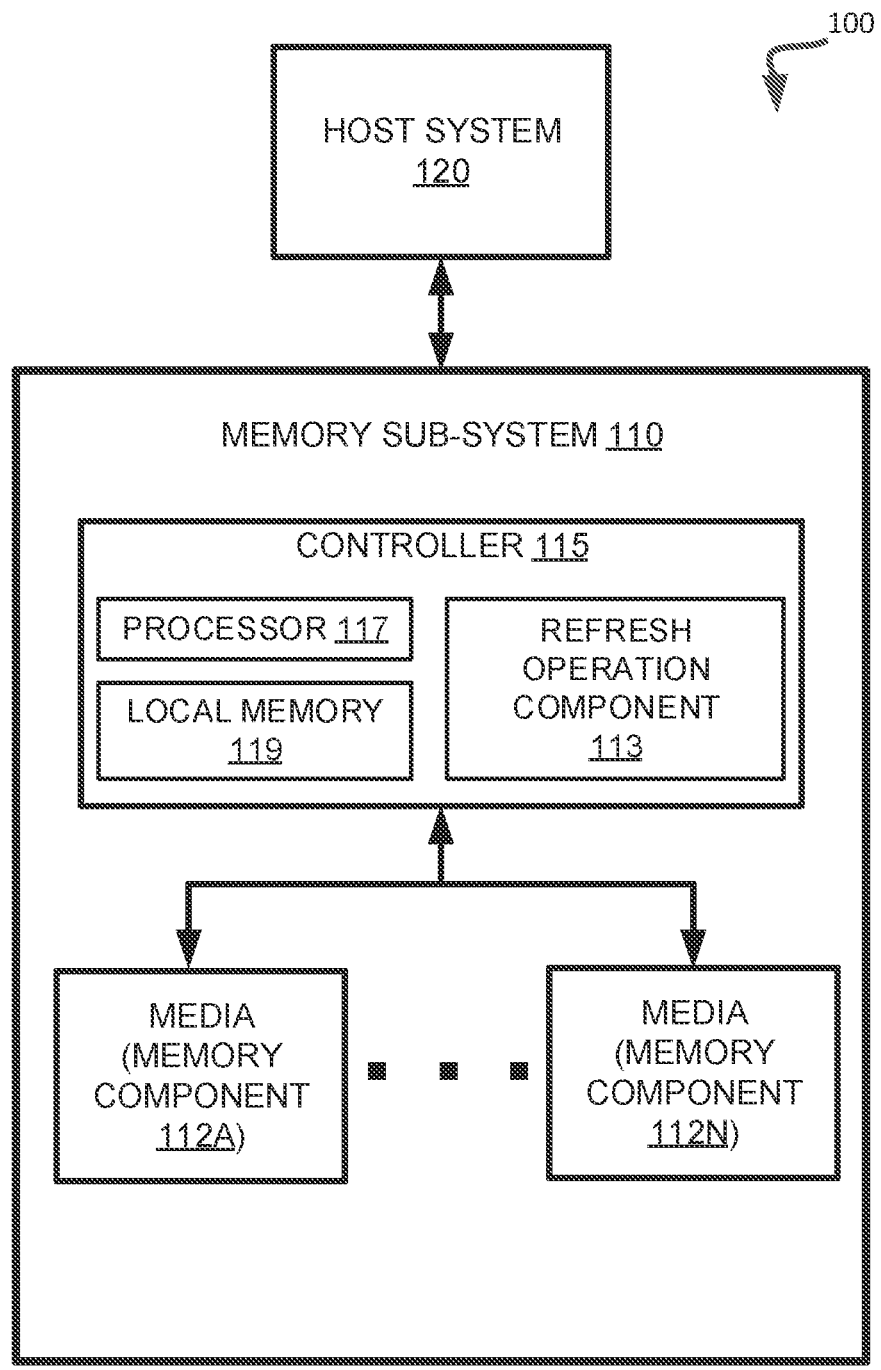
FIG. 1 illustrates an example computing environment that includes a memory sub-system in accordance with some embodiments of the present disclosure.

Aspects of the present disclosure are directed to performing a refresh operation based on a characteristic of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

A conventional memory sub-system can perform a refresh operation on memory cells of memory components included in the conventional memory sub-system. Such a refresh operation can be used to address the degradation of threshold voltage distributions that are used to represent bits of data at the memory cells. The degradation of the threshold voltage distribution in a memory cell can occur as a result of various factors such as memory cell voltage migration, a disturbance to the memory cell, and other factors that can shift or change the threshold voltage distribution at the memory cell over time. The conventional memory sub-system can perform the refresh operation on the memory cells to restore the threshold voltage distributions so that a larger margin or separation between a low voltage state and a higher voltage state can be present for the memory cells. The conventional memory sub-system can perform the refresh operation at a fixed frequency. For example, the refresh operation can be performed on a memory cell at fixed time intervals. However, performing the refresh operation for memory cells at fixed time intervals can result in memory cells being too frequently refreshed or not frequently being refreshed. For example, the threshold voltage distributions of memory cells can degrade or shift differently based on the performance of the memory sub-system. Performing the refresh operation too frequently can result in a degradation in performance of the memory sub-system as resources are used to perform the refresh operation instead of other read or write operations. Additionally, unnecessary refresh operations can result in excessive wear of memory cells, thereby decreasing the endurance of operating life of the memory cells. Performing the refresh operation too infrequently can result in increased errors at the memory cells as additional error correction operations may be needed to detect and correct errors for stored data as a result of the degraded or shifted threshold voltage distributions.

Aspects of the present disclosure address the above and other deficiencies by performing a refresh operation based on a characteristic of a memory sub-system. For example, the frequency or period of the performance of the refresh operation can be based on a characteristic such as the temperature, write count, or error condition of the memory sub-system. In some embodiments, the refresh operation can be performed based on a characteristic of a unit of the memory sub-system where the unit is the entire memory sub-system, a die or memory component, a group of memory cells or data block of the memory sub-system, or any other portion of the memory sub-system. The frequency of the refresh operation can be increased or decreased as the characteristic of the memory sub-system changes. For example, the refresh operation can be performed more frequently as the temperature of the memory sub-system increases, as the write count of the memory sub-system increases, and/or as the error condition (e.g., average bit error rate or number of read-retry trigger rates of an error control operation) increases. Thus, the frequency or period of the performance of the refresh operation can be updated as a condition or multiple conditions of the memory sub-system changes.

Advantages of the present disclosure include, but are not limited to, increased performance of the memory sub-system as the refresh operation can be performed based on observed characteristics or conditions of the memory sub-system that indicate whether the degradation of threshold voltage distributions is expected to decrease or increase at the memory cells of the memory sub-system. As a result, the refresh operation can be expected to perform at a desired refresh rate (e.g., not too frequently or infrequently) so that unnecessary refresh operations are not performed. Thus, the reliability of the memory sub-system can be improved while the performance of the memory sub-system is not reduced with unnecessary refresh operations.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DEVIM (SO-DEVIM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a refresh operation component 113 that can be used to perform a refresh operation for the memory sub-system 110. In some embodiments, the controller 115 includes at least a portion of the refresh operation component 113. For example, the controller 115 can include a processor 117 (processing device) configured to execute instructions stored in local memory 119 for performing the operations described herein. In some embodiments, the refresh operation component 113 is part of the host system 120, an application, or an operating system. In the same or alternative embodiments, portions of the refresh operation component 113 are part of the host system 120 while other portions of the refresh operation component 113 are performed at the controller 115.

The refresh operation component 113 can be used to perform a refresh operation for the memory sub-system. For example, the refresh operation component 113 can change or update a frequency of the performance of the refresh operation based on a characteristic of the memory sub-system. Such characteristics include, but are not limited to, the operating temperature, number of write operations, or error conditions of a unit of the memory sub-system. Further details with regards to the operations of the refresh operation component 113 are described below.

Figure 2:
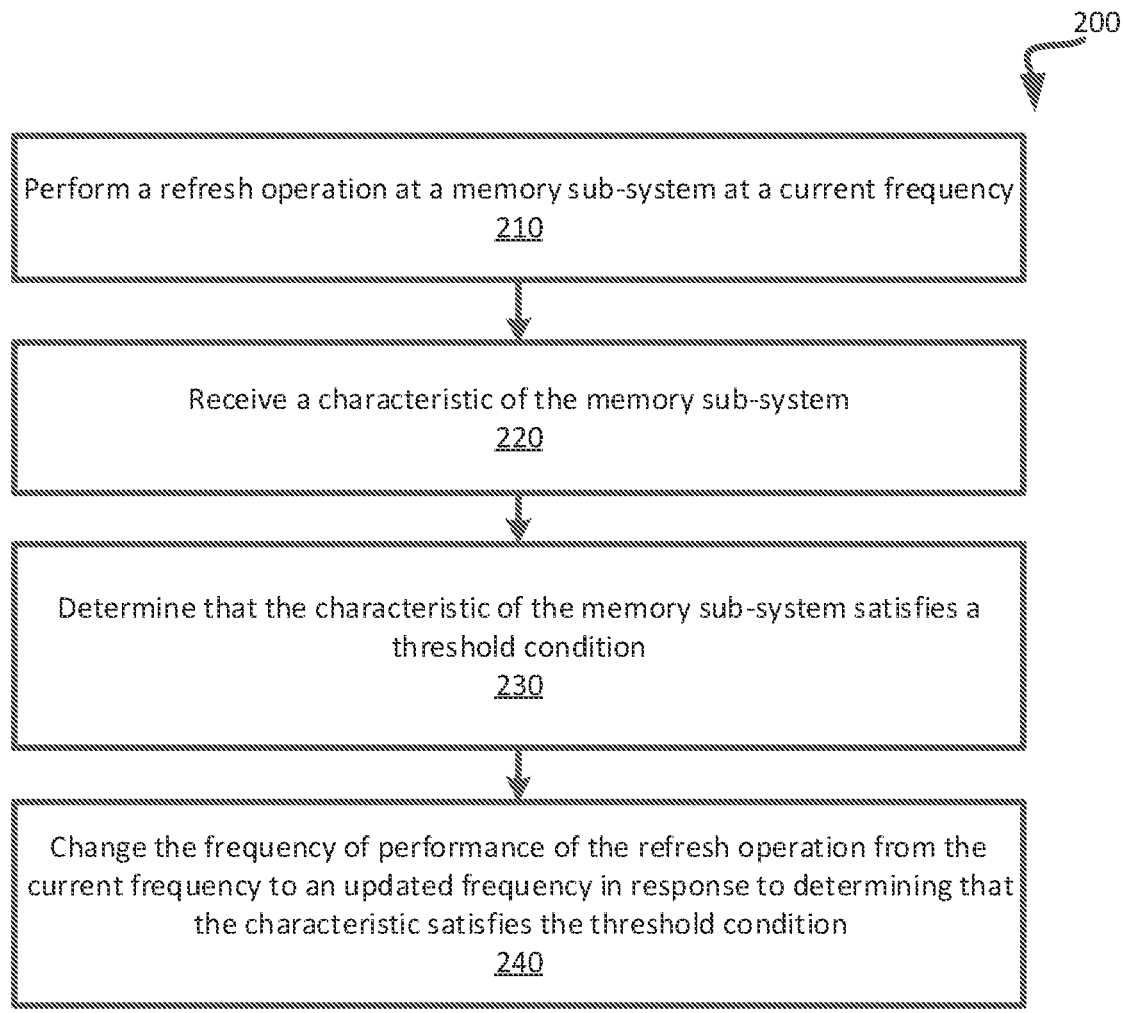
FIG. 2 is a flow diagram of an example method to perform a refresh operation based on a characteristic of a memory sub-system in accordance with some embodiments.

FIG. 2 is a flow diagram of an example method 200 to perform a refresh operation based on a characteristic of a memory sub-system in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the refresh operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic performs a refresh operation at a memory sub-system at a current frequency. For example, the refresh operation can be performed at memory cells of a unit of the memory sub-system. As previously described, a unit of the memory sub-system can be the entire memory sub-system, a memory component (i.e., a die) of the memory sub-system, or a group of memory cells or a data block of the memory sub-system. The refresh operation can be performed for memory cells of the unit of the memory sub-system once every time period corresponding to the current frequency. The refresh operation can be, but is not limited to, a write operation that is performed to re-write data at the memory cells of the unit. For example, bit values stored at a memory cell can be programmed again at the memory cell when the refresh operation is performed for the memory cell. In some embodiments, the refresh operation can be multiple consecutive write operations that are each performed to re-write the same data at the memory cells of the unit. In some embodiments, the refresh operation is consecutive write operations that are to write alternating states at the memory cells. For example, for a bit value of '0', the refresh operation can be an initial write operation to program the memory cell to a value of '1' and then a subsequent write operation to restore the memory cell to the value of '0.' Thus, consecutive write operations can be performed to write alternating states or values at the memory cell. The consecutive write operations can be an even number of write operations. In some embodiments, the refresh operation can be a read operation for the memory cells of the unit. In the same or alternative embodiments, the refresh operation that includes a write operation can be based on a read sub-operation that is performed during the write operation as the state or value of the memory cell is retrieved when performing the write operation to re-write the state or value of the memory cell.

At operation 220, the processing logic receives a characteristic of the memory sub-system. The characteristic can be an operating temperature and/or a number of write operations (i.e., write count) that have been performed at the unit of the memory sub-system as described in further detail with respect to FIG. 3. In some embodiments, the characteristic can be an error condition (e.g., an average bit error rate or read-retry trigger rate) of the unit of the memory sub-system as described in further detail with respect to FIGS. 4 and 5. At operation 230, the processing logic determines that the characteristic of the memory sub-system satisfies a threshold condition. For example, the threshold condition can be satisfied when the operating temperature of a unit of the memory sub-system is equal to or larger than a threshold operating temperature, when the number of write operations (i.e., the write count) that have been performed on the unit is equal to or larger than a threshold number of write operations, or when the error condition (e.g., the bit error rate or read-retry trigger rate) is equal to or satisfies a threshold error condition as described in further detail below. At operation 240, the process logic changes the frequency of performance of the refresh operation from the current frequency to an updated frequency in response to determining that the characteristic of the memory sub-system satisfies the threshold condition. For example, the frequency of the performance of the refresh operation can be increased so that the refresh operation is performed on a memory cell more frequently (i.e., the period decreases) or can be decreased so that the refresh operation is performed on a memory cell less frequently (i.e., the period increases).

Figure 3:
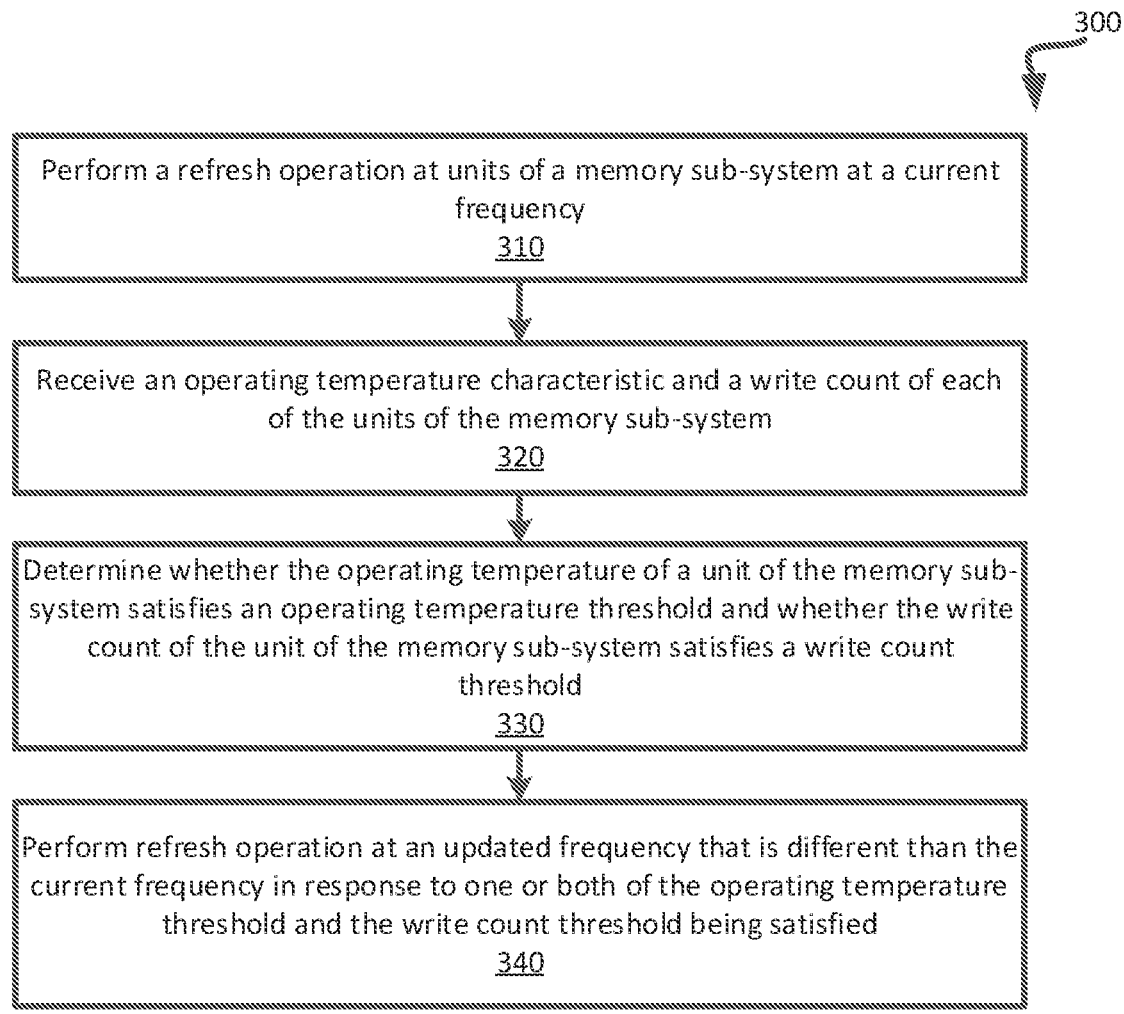
FIG. 3 illustrates a flow diagram of an example method to perform a refresh operation based on a write count or temperature of a memory sub-system in accordance with some embodiments of the present disclosure.

FIG. 3 is a flow diagram of an example method 300 to perform a refresh operation based on a write count or temperature of a memory sub-system in accordance with some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the refresh operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3, at operation 310, the processing logic performs a refresh operation at units of a memory sub-system at a current frequency. For example, the refresh operation can be performed at a lower frequency at the start or in the beginning of the operating life of the memory sub-system. The refresh operation can be performed at the various units of the memory sub-system at the current frequency during the beginning of the operating life of the memory sub-system. At operation 320, the processing logic receives an operating temperature characteristic and a write count of each of the units of the memory sub-system. For example, for each unit of the memory sub-system, the operating temperature characteristic and the write count of the respective unit of the memory sub-system can be received. The write count can specify the total number of write operations that have been performed on the respective unit of the memory sub-system. Furthermore, the operating temperature characteristics and the write counts of the units of the memory sub-system can be updated during the operating life of the memory sub-system. At operation 330, the processing logic determines whether the operating temperature of a unit of the memory sub-system satisfies an operating temperature threshold and whether the write count of the unit of the memory sub-system satisfies a write count threshold. For example, any unit of the memory sub-system that satisfies the operating temperature threshold and/or the write count threshold can be determined. The operating temperature of the unit can satisfy the operating temperature threshold when the operating temperature of the unit is equal to or exceeds the operating temperature threshold. Otherwise, the operating temperature of the unit can be determined to not satisfy the operating temperature threshold when the operating temperature of the unit is below the operating temperature threshold. The write count can satisfy the write count threshold when the total number of write operations performed at the unit is equal to or exceeds the write count threshold. Otherwise, the write count can be determined to not satisfy the write count threshold when the total number of write operations performed at the unit is below the write count threshold. At operation 340, the processing logic performs the refresh operation at an updated frequency that is different than the current frequency in response to one or both of the operating temperature threshold and the write count threshold being satisfied. For example, the frequency of the refresh operation can be increased or decreased. In some embodiments, the frequency of the refresh operation can be increased when the write count and/or the operating temperature increases to exceed a threshold. The frequency of the refresh operation can be decreased when the operating temperature decreases to be below a threshold.

In some embodiments, the frequency of the refresh operation can be adjusted (e.g., decreased or increased) based on either of a write count threshold or an operating temperature threshold being satisfied. In the same or alternative embodiments, the frequency of the refresh operation can be adjusted based on both a write count threshold and an operating temperature threshold being satisfied.

FIG. 4 illustrates various examples of the updating of the frequency of a refresh operation based on various threshold conditions in accordance with some embodiments of the present disclosure. The frequency of the refresh operation can be updated by the refresh operation component 113 of FIG. 1.

As shown in FIG. 4, various write count thresholds 410 can be used to update the frequency of the refresh operation. For example, as shown, the period of the refresh operation can be decreased (i.e., the frequency can be increased) as the write count of a unit of the memory sub-system increases. Similarly, various operating temperature thresholds 420 can be used to update the frequency of the refresh operation. For example, as shown in FIG. 4, the period of the refresh operation can be decreased (i.e., the frequency is increased) as the temperature of the unit of the memory sub-system increases. Similarly, different combined operating temperature and write count thresholds 430 can be used to update the frequency of the refresh operation. For example, the period or frequency of the refresh operation can be changed to different periods or frequencies depending on the combination of the operating temperature and the write count of the unit of the memory sub-system. Thus, the period of the refresh operation can thus change as a characteristic changes over the operating life of the memory sub-system.

In some embodiments, the refresh period can be increased (e.g., the frequency is decreased) when an upper write count threshold has been reached. For example, as shown, the refresh period can be decreased as the write count increases to 1 million write operations. However, at an upper write count threshold (e.g., 2 million write operations), the frequency of the refresh operation can be decreased. Thus, the frequency of the refresh operation can increase as a number of write count thresholds are reached until an upper write count threshold is reached. Once the upper write count threshold is reached, the frequency of the refresh operation can be decreased.

Figure 5:
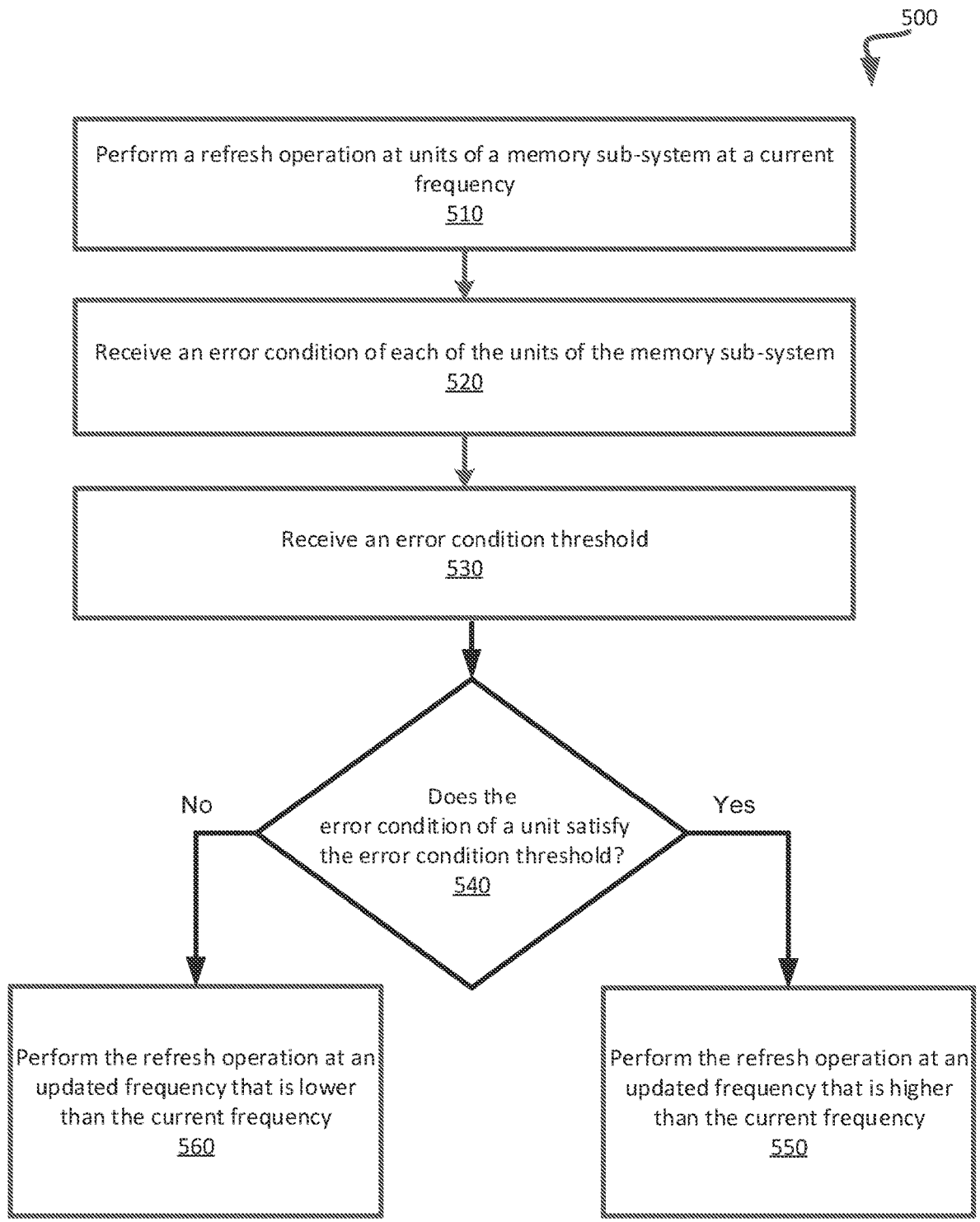
FIG. 5 is a flow diagram of an example method to perform a refresh operation based on an error condition of a memory sub-system in accordance with some embodiments.

FIG. 5 is a flow diagram of an example method to perform a refresh operation based on an error condition of a memory sub-system in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the refresh operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, at operation 510, the processing logic performs a refresh operation at units of a memory sub-system at a current frequency. For example, the refresh operation can be performed at one or more units of the memory sub-system at the current frequency. At operation 520, the processing logic receives an error condition of each of the units of the memory sub-system. For example, for each unit of the memory sub-system, the error condition the respective unit of the memory sub-system can be received. The error condition can be a bit error rate of the respective unit or a read-retry trigger rate associated with the unit. The bit error rate can be based on a number of bits of retrieved data that are errors (e.g., flipped from '0' to '1' or vice versa) when performing an error detection and correction operation for data that has read from the one or more memory cells of the respective unit. For example, the bit error rate can be a ratio of the number of bits of data that are errors to the total number of bits of the data that has been read. In some embodiments, the bit error rate can specify an average bit error rate for all units or a group of units of the memory sub-system. Furthermore, read-retry trigger rate can specify a rate of a number of times that the error correction operation could not fix errors in the retrieved data (e.g., there were too many bit errors) so that a repeated read operation was performed to retrieve the data again so that the error detection and correction operation could be performed on the data that was retrieved again. At operation 530, the processing logic receives an error condition threshold. In some embodiments, the error condition threshold can be based on a required error condition and a penalty factor. For example, the error condition threshold can be based on a required bit error rate (i.e., a certain bit error rate that can meet quality of service specifications) multiplied by the penalty factor (e.g., a value less than 1.0). In some embodiments, the error condition threshold can be based on a required read-retry trigger rate multiplied by another penalty factor. The penalty factors can be specified to be a value less than 1.0 so that the error condition threshold is below or satisfied before the required quality of service metrics that have been specified for the memory sub-system. At operation 540, the processing logic determines whether the error condition of a unit satisfies the error condition threshold. For example, a determination can be made as to whether any unit of the memory sub-system satisfies the error condition threshold. A unit can satisfy the error condition threshold when the error condition (e.g., the average bit error rate or read-retry trigger rate) is equal to or exceeds the error condition threshold. Otherwise, the error condition of the unit can be determined to not satisfy the error condition threshold when the error condition of the unit is below the error condition threshold. At operation 550, the processing logic performs the refresh operation at an updated frequency that is higher than the current frequency in response to the error condition threshold being satisfied. For example, the frequency of the refresh operation can be increased from the current frequency. Thus, the frequency of the refresh operation can be increased when the error condition increases to exceed the threshold. At operation 560, the processing logic performs the refresh operation at an updated frequency that is lower than the current frequency in response to the error condition threshold not being satisfied. For example, the frequency of the refresh operation can be decreased when the error condition decreases to be below a threshold.

Figure 6:
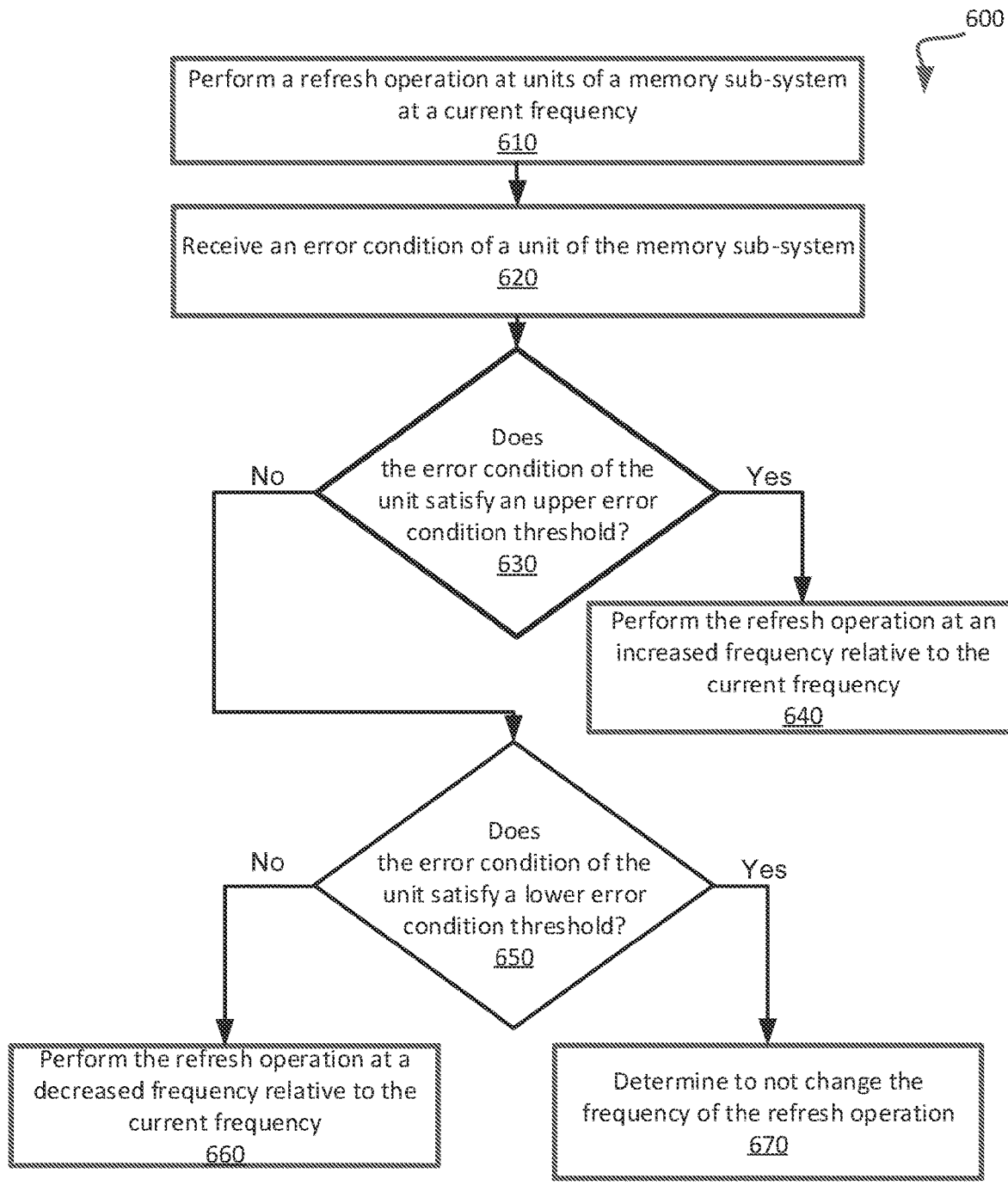
FIG. 6 is a flow diagram of an example method to determine whether to change a frequency of performance of a refresh operation based on multiple error conditions in accordance with some embodiments of the present disclosure.

FIG. 6 is a flow diagram of an example method 600 to determine whether to change a frequency of performance of a refresh operation based on multiple error conditions in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the refresh operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 6, at operation 610, the processing logic performs a refresh operation at units of a memory sub-system at a current frequency. For example, the refresh operation can be performed at the current frequency during the initial operating life of the memory sub-system or at a subsequent point during the operating life of the memory sub-system. At operation 620, the processing logic receives an error condition of a unit of the memory sub-system. For example, the average bit error rate or read-retry trigger rate for the unit of the memory sub-system may be retrieved as data is retrieved from the unit in response to a collection of read operations. At operation 630, the processing logic determines whether the error condition of the unit satisfies an upper error condition threshold. The upper error condition threshold can be a maximum error condition that is based on a penalty factor (e.g., a maximum average bit error rate or read-retry trigger based that is combined with a penalty factor). In response to determining that the error condition of the unit satisfies the upper error condition, the processing logic at operation 640 performs the refresh operation at an increased frequency relative to the current frequency. For example, the time interval between times when the memory cell or memory cells of the unit are refreshed can be decreased when the error condition of the unit is equal to or exceeds the upper error condition. Otherwise, if the error condition of the unit does not satisfy the upper error condition, then at operation 650, the processing logic determines whether the error condition of the unit satisfies a lower error condition threshold. The lower error condition threshold can be a minimum error condition that is based on a penalty factor (e.g., a minimum average bit error rate or read-retry trigger based that is combined with a penalty factor). In response to determining that the error condition of the unit does not satisfy the lower error condition, the processing logic at operation 660 performs the refresh operation at a decreased frequency relative to the current frequency. For example, the time interval between times when the memory cell or memory cells of the unit are refreshed can be increased when the error condition of the unit is lower than the lower error condition. Otherwise, if the error condition of the unit satisfies the lower error condition, the processing logic, at operation 670, determines to not change the frequency of the refresh operation. For example, the refresh operation can continue to be performed at the current frequency.

Thus, an upper error condition and a lower error condition can be used to increase or decrease the frequency of the refresh operation. If the error condition of a unit is between the upper error condition and the lower error condition, then the frequency of the refresh operation can remain unchanged until the error condition of the unit is later observed to satisfy (e.g., exceed or be lower than) the upper error condition or the lower error condition.

As previously described, the refresh operation can be multiple write operations to re-write the data at a unit. In some embodiments, the number of consecutively repeated write operations that each re-write the data can be based on the number of thresholds or conditions that have been satisfied. For example, as an increased threshold is satisfied, more write operations can be performed as the refresh operation as opposed to when a lower threshold is satisfied. For example, if the error condition is an average bit error rate, then more write operations can be performed for the refresh operation when a high bit error rate threshold is satisfied as opposed to when a lower bit error rate threshold is satisfied.

Figure 7:
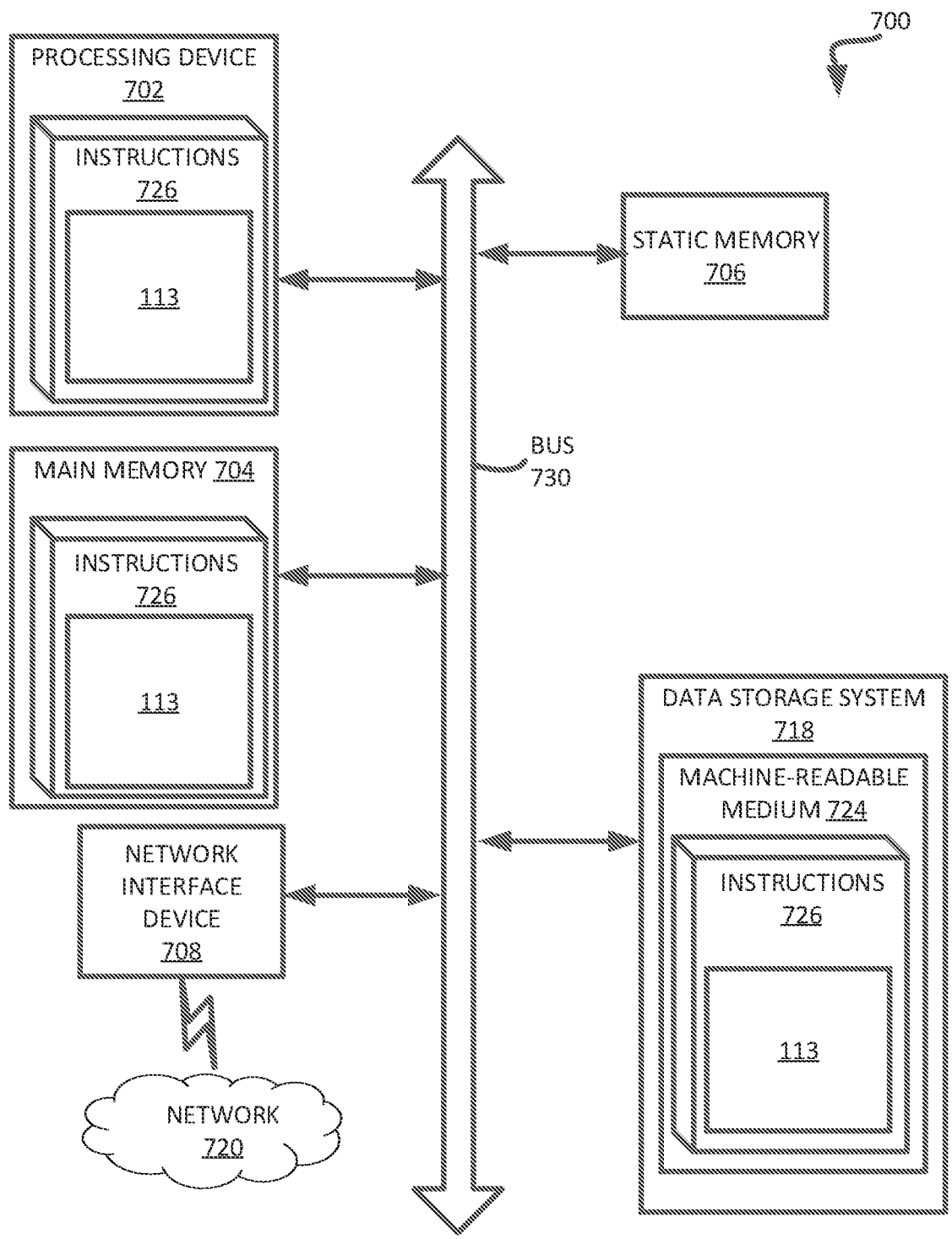
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a refresh operation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a refresh operation component (e.g., the refresh operation component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer.

Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    performing, at a current frequency, a media management operation at a memory sub-system;
    identifying an operating characteristic associated with the memory sub-system, wherein the operating characteristic reflects at least one of a write count, a bit error rate, or a read-retry trigger rate;
    determining whether the identified operating characteristic satisfies an operating characteristic criterion; and
    responsive to determining that the operating characteristic satisfies the characteristic criterion, performing the media management operation at a different frequency relative to the current frequency.

2. The method of claim 1, wherein the media management operation comprises a refresh operation.

3. The method of claim 2, wherein the refresh operation corresponds to at least one of one or more write operations to re-write data stored at one or more units of the memory sub-system or one or more read operations to read of the data stored at the one or more units of the memory sub-system.

4. The method of claim 3, wherein the one or more write operations are to re-write data based on alternating states at the one or more units of the memory sub-system.

5. The method of claim 1, wherein the operating characteristic reflects the write count, and wherein determining whether the identified operating characteristic satisfies an operating characteristic criterion comprises determining whether the write count satisfies a write count threshold.

6. The method of claim 5, wherein determining whether the write count satisfies the write count threshold comprises:
    determining whether a number of write operations performed at a particular unit of the memory sub-system satisfies a threshold number of write operations, wherein the write count satisfies the write count threshold responsive to determining that the number of write operations of the particular unit satisfies the threshold number of write operations.

7. The method of claim 1, wherein the media management operation is performed at an increased frequency relative to the current frequency.

8. The method of claim 7, wherein method further comprises:
    determining whether an operating temperature of the memory sub-system satisfies an operating temperature threshold; and
    responsive to determining that the operating temperature does not satisfy the operating temperature threshold, performing the media management operation at a lower frequency relative to the increased frequency.

9. The method of claim 1, further comprising:
    responsive to determining that the operating characteristic does not satisfy the characteristic criterion, performing the media management operation at a decreased frequency relative to the current frequency.

10. A system comprising:
    a memory component; and
    a processing device, operatively coupled with the memory component, to perform operations comprising:
        performing, at a current frequency, a media management operation at a memory sub-system;
        identifying an operating characteristic associated with the memory sub-system, wherein the operating characteristic reflects at least one of a write count, a bit error rate, or a read-retry trigger rate;
        determining whether the identified operating characteristic satisfies an operating characteristic criterion; and
        responsive to determining that the operating characteristic satisfies the characteristic criterion, performing the media management operation at a different frequency relative to the current frequency.

11. The system of claim 10, wherein the media management operation comprises a refresh operation.

12. The system of claim 11, wherein the refresh operation corresponds to at least one of one or more write operations to re-write data stored at one or more units of the memory sub-system or one or more read operations to read of the data stored at the one or more units of the memory sub-system.

13. The system of claim 12, wherein the one or more write operations are to re-write data based on alternating states at the one or more units of the memory sub-system.

14. The system of claim 10, wherein the operating characteristic reflects the write count, and wherein determining whether the identified operating characteristic satisfies an operating characteristic criterion comprises determining whether the write count satisfies a write count threshold.

15. The system of claim 14, wherein determining whether the write count satisfies the write count threshold comprises:
    determining whether a number of write operations performed at a particular unit of the memory sub-system satisfies a threshold number of write operations, wherein the write count satisfies the write count threshold responsive to determining that the number of write operations of the particular unit satisfies the threshold number of write operations.

16. The system of claim 10, wherein the media management operation is performed at an increased frequency relative to the current frequency.

17. A non-transitory computer readable medium comprising instructions, which when executed by a processing device, cause the processing device to perform operations comprising:
performing, at a current frequency, a media management operation at a memory sub-system;
identifying an operating characteristic associated with the memory sub-system, wherein the operating characteristic reflects at least one of a write count, a bit error rate, or a read-retry trigger rate;
determining whether the identified operating characteristic satisfies an operating characteristic criterion; and
responsive to determining that the operating characteristic satisfies the characteristic criterion, performing the media management operation at a different frequency relative to the current frequency.

18. The non-transitory computer readable medium of claim 17, wherein the media management operation comprises a refresh operation.

19. The non-transitory computer readable medium of claim 18, wherein the refresh operation corresponds to at least one of one or more write operations to re-write data stored at one or more units of the memory sub-system or one or more read operations to read of the data stored at the one or more units of the memory sub-system.

20. The non-transitory computer readable medium of claim 19, wherein the one or more write operations are to re-write data based on alternating states at the one or more units of the memory sub-system.

* * * * *